United States Patent
Young

(10) Patent No.: US 10,969,848 B2
(45) Date of Patent: Apr. 6, 2021

(54) SYSTEM POWER MONITOR

(71) Applicant: Alpha and Omega Semiconductor (Cayman) Ltd., Grand Cayman (KY)

(72) Inventor: Chris M. Young, Round Rock, TX (US)

(73) Assignee: Alpha & Omega Semiconductor (Cayman) Ltd., Grand Cayman (KY)

( * ) Notice: Subject to any disclaimer, the term of this patent is extended or adjusted under 35 U.S.C. 154(b) by 258 days.

(21) Appl. No.: 16/046,469

(22) Filed: Jul. 26, 2018

(65) Prior Publication Data
US 2020/0033925 A1    Jan. 30, 2020

(51) Int. Cl.
G06F 1/26    (2006.01)
G06F 1/28    (2006.01)
H02J 4/00    (2006.01)
H03G 3/30    (2006.01)

(52) U.S. Cl.
CPC ............ *G06F 1/28* (2013.01); *G06F 1/263* (2013.01); *H02J 4/00* (2013.01); *H03G 3/30* (2013.01)

(58) Field of Classification Search
USPC ........................................... 307/24
See application file for complete search history.

(56) References Cited

U.S. PATENT DOCUMENTS

| 9,455,619 | B1* | 9/2016 | Granat | H02J 1/102 |
| 2006/0091961 | A1* | 5/2006 | Briskin | H03K 17/0822 330/298 |
| 2013/0241284 | A1* | 9/2013 | Santini | H02J 4/00 307/31 |
| 2016/0126730 | A1* | 5/2016 | Mahajan | G01R 35/005 307/80 |
| 2017/0077833 | A1* | 3/2017 | Walters | H05B 45/14 |

* cited by examiner

*Primary Examiner* — Rexford N Barnie
*Assistant Examiner* — Xuan Ly
(74) *Attorney, Agent, or Firm* — Carmen C. Cook

(57) ABSTRACT

A system power monitor circuit and method implemented in a system including multiple power supplies measures and scales the power supply output current value at each power supply as a ratio of the power supply output voltage and a reference voltage. Scaled power supply output current values are combined to provide a single system current signal that is referenced to the same reference voltage value being the system voltage signal. The system power is determined from the system current signal and the system voltage signal. In some embodiment, a power supply output voltage of a selected power supply is used as the reference voltage.

20 Claims, 7 Drawing Sheets

SYSTEM POWER MONITOR

FIELD OF THE INVENTION

The invention relates to power monitoring for electronic systems and, in particular, to a system and method for monitoring power consumption in a system with multiple power sources.

BACKGROUND OF THE INVENTION

A power module for an electronic system receives power from a power source and delivers regulated voltage or current to components of the electronic system. Typically, the power module is constructed as a voltage regulator which includes a voltage regulator controller and power switching devices. For example, the voltage regulator may be a DC-to-DC converter and delivers a regulated DC voltage to the load.

In a typical configuration, an electronic system may include multiple power modules delivering power to different components of the electronic system. For example, an electronic system may include multiple processors or central processing units (CPU) where each processor is coupled to a respective power module to receive a regulated input voltage from a power source. In some applications, the electronic system may require the power module to monitor the power usage or power consumption by the processor. An electronic system may use the power consumption information to adjust the system operation. For example, if the processor is drawing too much power, the processor speed may be throttled or the clock frequency may be reduced to reduce the power loading on the processor. In typical system configurations, a power module may monitor the power it is delivering to the load and report the power usage data to a system host. For example, a power module coupled to a processor may monitor the power it is delivering to the processor and report the processor power usage to the system host.

Increasingly, the power consumption of an electronic system is no longer dominated or limited by the processor itself. Rather, the power consumption of the entire system becomes informative of the power loading condition experienced by the system. Accordingly, there is an increased interest in measuring the power consumption of an electronic system. Measuring system power becomes challenging especially when the system is powered by multiple power supplies.

BRIEF DESCRIPTION OF THE DRAWINGS

Various embodiments of the invention are disclosed in the following detailed description and the accompanying drawings.

DETAILED DESCRIPTION

Figure 1:
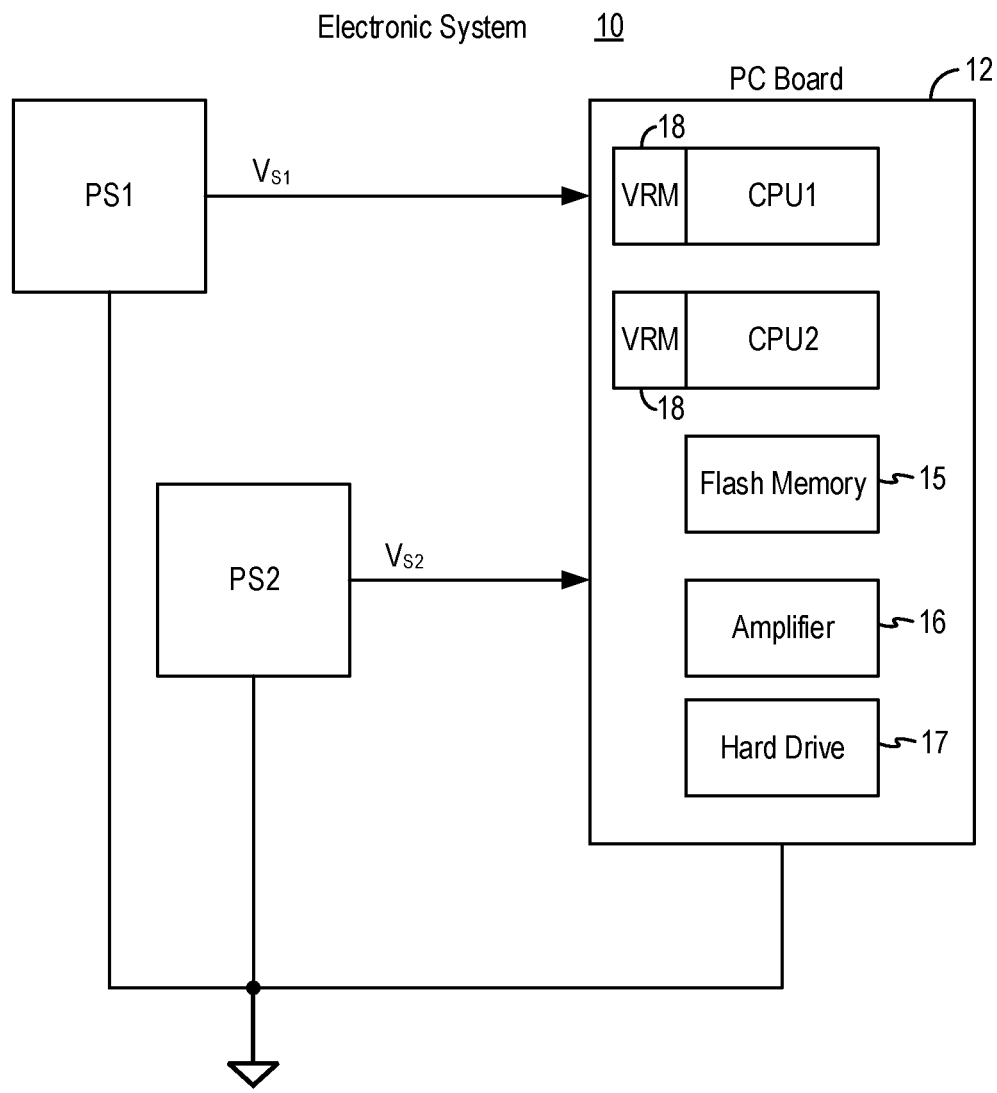
FIG. 1 illustrates a configuration of an electronic system including multiple power supplies.

The invention can be implemented in numerous ways, including as a process; an apparatus; a system; a composition of matter; a computer program product embodied on a computer readable storage medium; and/or a processor, such as a hardware processor or a processor device configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to one aspect of the present invention, a method for determining system power in an electronic system including multiple power supplies combines power supply output current values by scaling each output current value as a ratio of the power supply output voltage and a reference voltage. The scaled power supply output current values can then be summed to provide a single system current signal that is relative to the reference voltage which is taken as a system voltage signal. In this manner, the method provides a single system current signal and a single system voltage signal with which to determine the system power.

According to another aspect of the present invention, a system power monitor circuit is implemented in an electronic system including multiple power supplies to measure and scale the power supply output current value at each power supply as a ratio of the power supply output voltage and a reference voltage. Accordingly, the power supply output current values of all the power supplies are scaled to the same reference voltage value and the scaled power supply output current values can be combined to provide a single system current signal while the reference voltage is taken as a system voltage signal. The system power can then be determined from the system current signal and the system voltage signal. In some embodiments, the scaled power supply output current values are reported to a power module in the electronic system where the scaled current values are combined and the system power is determined.

In the present description, an electronic system generally refer to a system built on a printed circuit board and including one or more processors (or Central Processing Units (CPU)) and other electronic components, such as analog or digital integrated circuits, memory integrated circuits, memory devices or hard drives. Examples of an electronic system includes mother boards or server boards of a computing system. In the present description, an electronic system generally includes one or more processors formed on a board and the electronic system is generally supplied by one or more power supplies.

FIG. 1 illustrates a configuration of an electronic system including multiple power supplies. Referring to FIG. 1, an electronic system 10 may include one or more processors or CPUs and other electronic components. The CPUs and the electronic components may be mounted on a printed circuit board 12. In the present example, the electronic system 10 includes a first processor CPU1, a second processor CPU2, a flash memory 15, an amplifier circuit 16 and a hard drive 17. The components in the electronic system 10 are illustrative only. In some examples, the electronic system 10 may be a server board or a mother board of a computing system. The electronic system 10 may be supplied by multiple power supplies. In the present example, the electronic system 10 is supplied by a first power supply PS1 providing a power supply output voltage $V_{S1}$ and a second power supply PS2 providing a power supply output voltage $V_{S2}$. The power supplies PS1 and PS2 may both provide the same output voltage value, e.g. 12V, or they may provide different output voltage values, e.g. 12V and 5V.

In typical system configurations, the processors receive regulated power through voltage regulator modules (VRM) 18. In particular, each processor is coupled to a respective voltage regulator module 18 which receive input power from a power supply. The voltage regulator module 18 provides regulated power, such as a regulated voltage, to supply the processor. The voltage regulator module 18 typically includes a voltage regulator controller ("controller") and power switching devices to generate the regulated voltage based on the input voltage from the power supply.

Existing system operations often require the monitoring of the processor power consumption. The processor power consumption may be used to throttle the processor speed or to reduce the clock frequency in response to the processor power consumption level. Since each processor is coupled to a respective voltage regulator module, the process power usage can be measured at the voltage regulator module. Accordingly, existing system operations typically relies on the voltage regulator module to measure the power it is delivering to the processor and to report the measured power as the processor power consumption.

Lately, there is an increased interest in measuring the power consumption by the entire electronic system, instead of only the power consumption of the processor. This is because the processor power consumption may not be limiting for the system as long as the power for the system is not limited. Accordingly, measuring the system power, that is, the power consumption for the entire electronic system, becomes of interest. However, there are challenges in measuring the system power consumption in an electronic system including multiple power supplies.

More specifically, power (P) is given by the voltage (V) multiplied by current (I). That is, $P=V*I$. However, in a system with multiple power supplies, the system voltage and system current values need to be combined in a way to give a meaningful power value for the entire system. In embodiments of the present invention, a system power monitor circuit and method is provided to determine system power of an electronic system including two or more power supplies by providing a single system current value signal and a single system voltage with which to determine system power.

Figure 2:
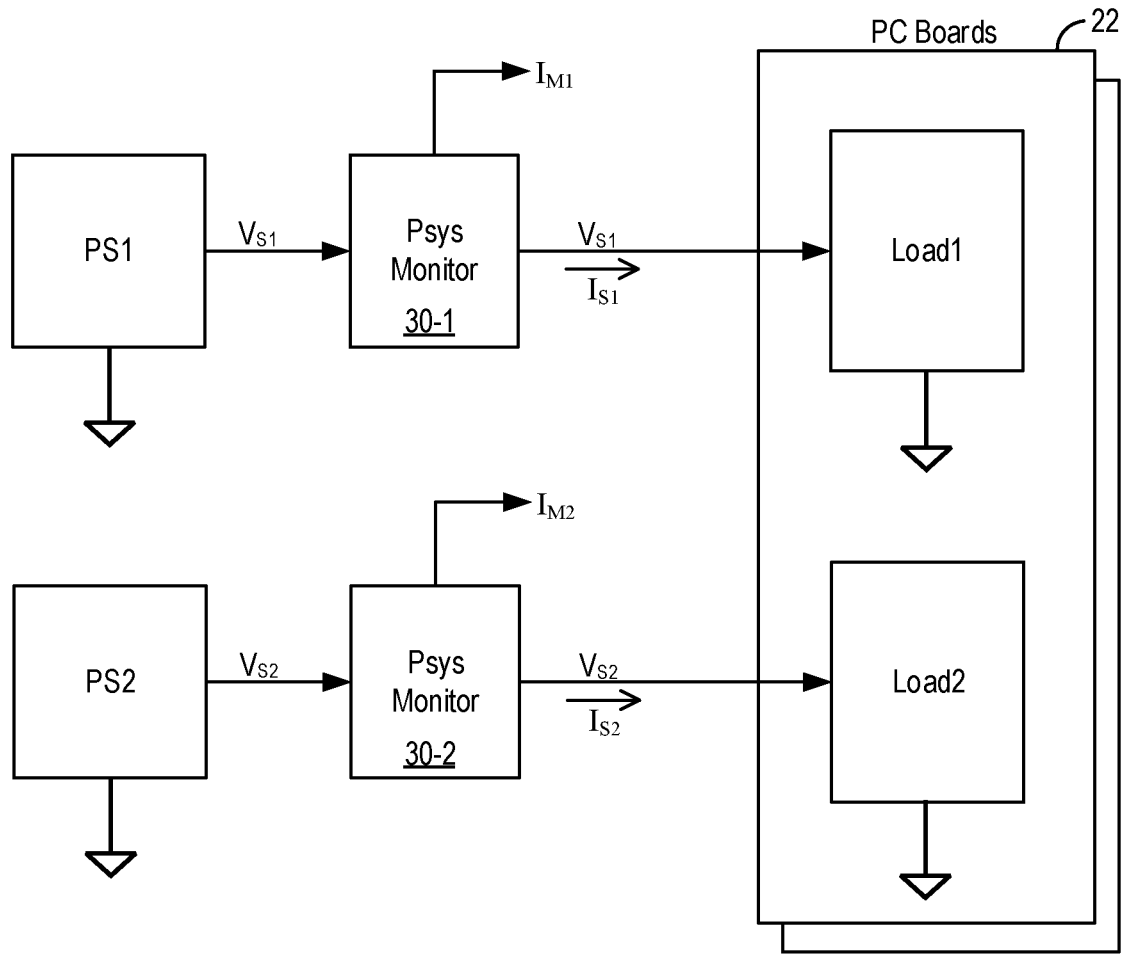
FIG. 2 is a block diagram illustrating an electronic system incorporating one or more system power monitor circuits in embodiments of the present invention.

FIG. 2 is a block diagram illustrating an electronic system incorporating one or more system power monitor circuits in embodiments of the present invention. Referring to FIG. 2, an electronic system 20 may include processors and electronic components formed on one or more printed circuit boards 22. The electronic system 20 is supplied by a first power supply PS1 providing a power supply output voltage $V_{S1}$ and a second power supply PS2 providing a power supply output voltage $V_{S2}$. Different components in the electronic system 20 are supplied by respective first and second power supplies PS1, PS2. In the present example, Load1 and Load2 represent different combinations of the processors and electronic components of the electronic system that are being supplied by the first and second power supplies PS1 and PS2. Load1 is supplied by the first power supply PS1 and Load2 is supplied by the second power supply PS2.

The power supplies PS1 and PS2 may both provide the same output voltage value, e.g. 12V, or they may provide different output voltage values, e.g. 12V and 5V. However, even though power supplies PS1 and PS2 may be programmed to generate the same power supply output voltage value, two independent power supplies will never generate exactly the same output voltage value. For example, even when power supplies PS1 and PS2 are both programmed to generate 12V as the output voltage, one of the power supply may generate 12V and the other power supply may generate 12.0001V.

To facilitate determination of system power usage or consumption, a system power monitor circuit 30 is coupled to each power supply PS1, PS2. In particular, the system power monitor circuit 30 is coupled in line with the power supply and the load. The system power monitor circuit 30 is coupled to the power supply to detect the power supply output current and the power supply output voltage delivered by the respective power supply to the respective load. For example, the system power monitor circuit 30-1 coupled to the first power supply PS1 measures the power supply output current $I_{S1}$ and the power supply output voltage $V_{S1}$ of the first power supply PS1. Meanwhile, the system power monitor circuit 30-2 coupled to the second power supply PS2 measures the power supply output current $I_{S2}$ and the power supply output voltage $V_{S2}$ of the second power supply PS2.

The system power monitor circuit 30 scales the measured power supply output current value by a ratio of the respective power supply output voltage and a reference voltage to generate a scaled power supply output current value. Accordingly, the system power monitor circuit 30-1 generates a scaled power supply output current value $I_{M1}$ and the system power monitor circuit 30-2 generates a scaled power supply output current value $I_{M2}$.

In one embodiment, the reference voltage is a pre-determined voltage that is provided to or known to the system power monitor circuit. All the system power monitor circuits scale the power supply output current using the same reference voltage.

In another embodiment, a power supply output voltage from one of the power supplies is selected as the reference voltage. In that case, the system power monitor circuit corresponding to the selected power supply is referred to as the reference system power monitor circuit. The reference system power monitor circuit does not need to scale the power supply output current from the selected power supply. Alternately, the reference system power monitor circuit can scale the power supply output current by a ratio of 1. The other system power monitor circuits scale the respective power supply output current values by a ratio of the respective power supply output voltage and the reference voltage which is the power supply output voltage of the selected power supply.

With each system power monitor circuits generating the scaled power supply output current values that are referenced to the same reference voltage, the scaled current values can be summed to generate a system current signal indicative of the system current. The reference voltage is taken as the system voltage signal. With the system current signal and the system voltage signal thus determined, the system power can be determined by multiplication of the system current signal and the system power signal. In some embodiments, the scaled power supply output current values $I_{MX}$ are provided to a host, such as a controller circuit of the electronic system 20, to be combined and to determine the system power. In the case a power supply output voltage is selected as the reference voltage, the power supply output voltage may also be provided to the host to determine the system power.

More specifically, the current scaling operation by the system power monitoring circuits generates scaled power supply output current values that can be used to determine the system power as follows. In a first embodiment, the system power monitoring circuits use a predetermined voltage as the reference voltage $V_{REF}$. For each power supply providing a power supply output voltage $V_{SX}$, the power supply output current is scaled by the ratio of $V_{SX}/V_{REF}$. For the case of two power supplies, the system current $I_{SYS}$ is given as follows:

$$I_{sys} = I_{M1} + I_{M2} = I_{S1} * \frac{V_{S1}}{V_{REF}} + I_{S2} * \frac{V_{S2}}{V_{REF}}.$$

The system current $I_{SYS}$ represents a single current signal that can be used to determine system power. The system power $P_{SYS}$ can thus be determined as follows:

$$P_{sys} = V_{REF} * I_{sys} = I_{S1} * V_{S1} + I_{S2} * V_{S2}.$$

In a second embodiment, one of the power supplies (e.g. $V_{S1}$) is selected as the reference voltage $V_{REF}$. For each of the other power supply providing a power supply output voltage $V_{SX}$, the power supply output current is scaled by the ratio of $V_{SX}/V_{REF}$. For the case of two power supplies, the system current $I_{SYS}$ is given as follows:

$$I_{sys} = I_{REF} + I_{M2} = I_{REF} + I_{S2} * \frac{V_{S2}}{V_{REF}}.$$

The system current $I_{SYS}$ represents a single current signal that can be used to determine system power. The system power $P_{SYS}$ can thus be determined as follows:

$$P_{sys} = V_{REF} * I_{sys} = I_{S1} * V_{S1} + I_{S2} * V_{S2}.$$

Figure 3:
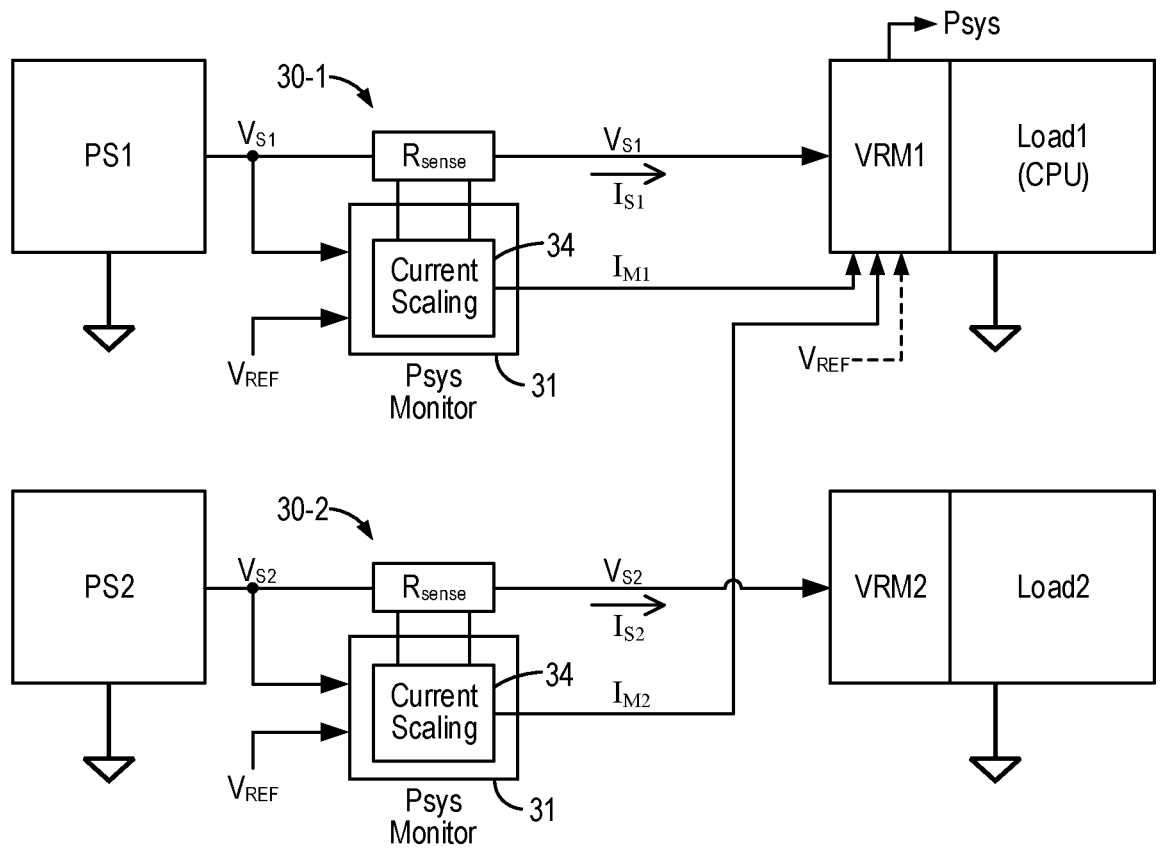
FIG. 3 is a schematic diagram of an electronic system incorporating one or more system power monitor circuits in embodiments of the present invention.

FIG. 3 is a schematic diagram of an electronic system incorporating one or more system power monitor circuits in embodiments of the present invention. Referring to FIG. 3, a system power monitor circuit 30 is coupled to each power supply to sense the power supply output voltage and the power supply output current and to generate a scaled power supply output current value. For example, a system power monitor circuit 30-1 is coupled to the first power supply PS1 and a system power monitor circuit 30-2 is coupled to the second power supply PS2. In the present embodiment, the system power monitor circuit 30 senses the power supply output current using a current sense resistor $R_{sense}$. The current sense resistor $R_{sense}$ is coupled in series between the power supply and the respective load. The system power monitor circuit 30 measures the voltage across the current sense resistor $R_{sense}$ as a voltage signal indicative of the power supply output current. In other embodiments, other means for sensing the power supply output current can be used. Meanwhile, the system power monitor circuit 30 also senses the power supply output voltage and receives a reference voltage $V_{REF}$. The reference voltage $V_{REF}$ can be a predetermined voltage or a power supply output voltage selected from one of the power supplies.

The system power monitor circuit 30 includes a current scaling circuit 34 configured to scale the measured power supply output current by a ratio of the power supply output voltage to the reference voltage $V_{REF}$. In some embodiments, the current scaling circuit 34 is formed as a power monitor integrated circuit 31. Each system power monitor circuit 30 generates a scaled power supply output current value $I_{MX}$. For example, at power supply PS1, the system power monitor circuit 30-1 measures the power supply output current $I_{S1}$ and senses the power supply output voltage $V_{S1}$. The system power monitor circuit 30-1 generates a scaled power supply output current value $I_{M1}$ which is scaled by a ratio of the power supply output voltage $V_{S1}$ and the reference voltage $V_{REF}$. In another example, at power supply PS2, the system power monitor circuit 30-2 measures the power supply output current $I_{S2}$ and senses the power supply output voltage $V_{S2}$. The system power monitor circuit 30-2 generates a scaled power supply output current value $I_{M2}$ which is scaled by a ratio of the power supply output voltage $V_{S2}$ and the reference voltage $V_{REF}$.

In embodiments of the present invention, the scaled power supply current values $I_{MX}$ are coupled to a controller circuit to be combined and to generate the system power value. In the present embodiment, a controller in a voltage regulator module of the electronic system 20 is used to process the scaled power supply current values and to generate the system power value. In particular, the electronic system 20 typically includes at least one voltage regulator module, e.g. VRM1, coupled to provide a regulated voltage to a load, such as Load1. Load1 can be the processor or CPU of the system. The electronic system 20 may include other voltage regulator modules, such as VRM2. Only one of the voltage regulator modules needs to be designated for use to generate the system power value.

In embodiments of the present invention, the controller of the voltage regulator module VRM1 is configured to receive the scaled current values $I_{M1}$ and $I_{M2}$. The controller of the voltage regulator module VRM1 combines or sums the scaled current values to generate a single current signal as the system current signal. The controller of the voltage regulator module VRM1 is configured to receive the reference voltage $V_{REF}$ as the signal system voltage signal. In some embodiments, the reference voltage is a pre-determined reference voltage and may be known to the controller and thus does not need to be provided. Alternately, the reference voltage may be provided to the controller. In other embodiments, the reference voltage is a selected power supply output voltage that may be provided to the controller, such as by the reference system power monitor circuit. The controller of the voltage regulator module VRM1 generates the system power output signal Psys using the system current signal and the system voltage signal. In one embodiment, the voltage regulator module VRM1 generates the system power Psys output signal by multiplying the system current signal with the system voltage signal.

Figure 4:
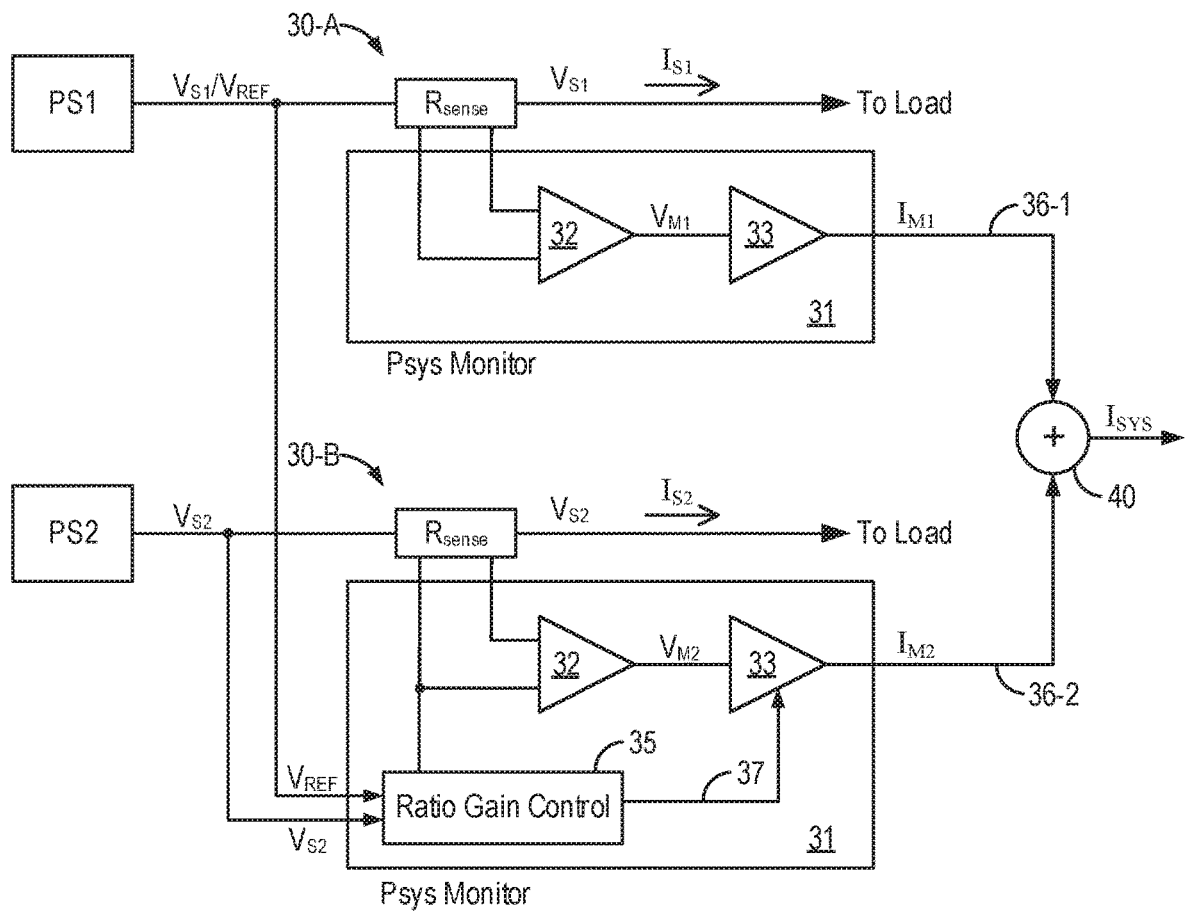
FIG. 4 is a circuit diagram illustrating the construction of system power monitor circuits in some embodiments.

FIG. 4 is a circuit diagram illustrating the construction of system power monitor circuits in some embodiments. Referring to FIG. 4, a system power monitor circuit 30-A is coupled to a power supply PS1 and a system power monitor circuit 30-B is coupled to a power supply PS2. In the present embodiment, the power supply PS1 is selected as the reference power supply and the power supply output voltage $V_{S1}$ is taken as the reference voltage. In the present embodiment, the system power monitor circuit 30-A is configured as a reference system power monitor circuit and the power supply output current from the reference power supply does not need to be scaled. Accordingly, system power monitor circuit 30-A can be constructed without the current scaling circuitry.

In one embodiment, system power monitor circuit 30-A includes a differential amplifier 32 to sense the voltage across the current sense resistor $R_{sense}$ and to generate an output voltage $V_{M1}$ indicative of the current $I_{S1}$ flowing through the sense resistor $R_{sense}$. The output voltage $V_{M1}$ of the differential amplifier 32 is coupled to a transconductance amplifier 33 which converts the voltage signal $V_{M1}$ to an output current signal $I_{M1}$ (node 36-1). In this case, the output current signal $I_{M1}$ is not scaled and is referred to as the reference power supply output current $I_{M1}$ or the output current signal $I_{M1}$ can be described as a scaled power supply output current scaled by a factor of 1 since the ratio of $V_{S1}/V_{REF}$ is 1.

For the other power supplies not being used as the reference, the system power monitor circuit 30-B is used. For example, the system power monitor circuit 30-B is coupled to the power supply PS2. System power monitor circuit 30-B includes a differential amplifier 32 to sense the voltage across the current sense resistor $R_{sense}$ and to generate an output voltage $V_{M2}$ indicative of the current $I_{S2}$ flowing through the sense resistor $R_{sense}$. The output voltage $V_{M2}$ of the differential amplifier 32 is coupled to a transconductance amplifier 33 which converts the voltage signal $V_{M2}$ to an output current signal $I_{M2}$ (node 36-2). The system power monitor circuit 30-B further includes a ratio gain control circuit 35 configured to adjust the gain of the transconductance amplifier 33 in proportion to the ratio of the power supply output voltage $V_{S2}$ to the reference voltage $V_{REF}$. In this case, the reference voltage is the power supply output voltage $V_{S1}$. The power supply output voltage $V_{S2}$ and the reference voltage $V_{REF}$ (or $V_{S1}$) are provided to the ratio gain control circuit 35. The ratio gain control circuit 35 generates a gain control signal (node 37) in response to the ratio of the power supply output voltage $V_{S2}$ and the reference voltage $V_{REF}$ (or $V_{S1}$). The gain control signal is used to adjust the gain of the transconductance amplifier 33 so as to scale the sensed current value. In this manner, the output current signal $I_{M2}$ is scaled by the respective voltage ratio and is a scaled version of the power supply output current $I_{S2}$.

Figure 7:
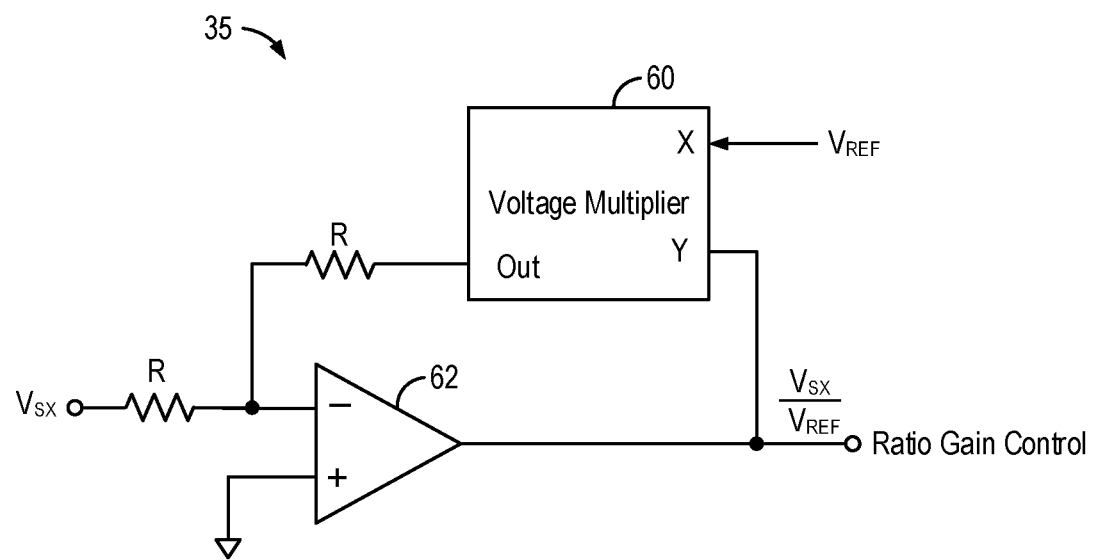
FIG. 7 is a schematic diagram of a ratio gain control circuit in some embodiments.

In one embodiment, the ratio gain control circuit 35 is constructed as a voltage divider circuit. The ratio gain control circuit 35 operates to divide the respective power supply output voltage $V_{SX}$ by the reference voltage $V_{REF}$. The gain control signal is the voltage ratio of $V_{SX}$ to $V_{REF}$. FIG. 7 is a schematic diagram of a ratio gain control circuit in some embodiments. In the example embodiment shown in FIG. 7, the ratio gain control circuit is constructed using a voltage multiplier 60 configured in a feedback loop with an operational amplifier 62. The ratio gain control circuit in FIG. 7 is illustrative only and not intended to be limiting. In other embodiments, other circuits and methods to generate the ratio of the power supply output voltage to the reference voltage can be used.

Figure 8:
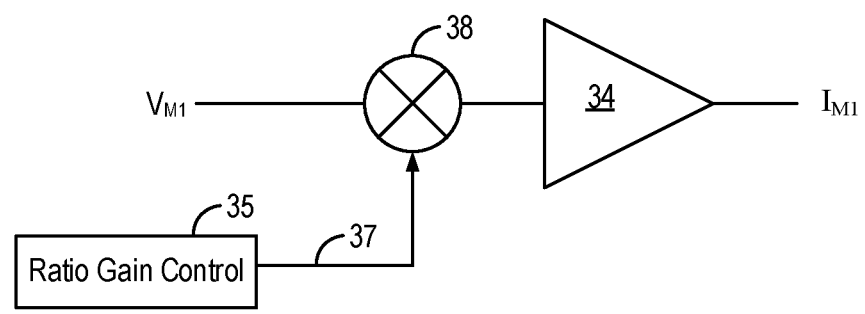
FIG. 8 is a schematic diagram illustrating an implementation of a variable gain transconductance amplifier in some embodiments.

Furthermore, in one embodiment, the transconductance amplifier 33 is a variable gain transconductance amplifier where the gain is adjusted by the gain control signal (node 37). FIG. 8 is a schematic diagram illustrating an implementation of a variable gain transconductance amplifier in some embodiments. In the example embodiment shown in FIG. 8, the gain of the transconductance amplifier 33 is adjusted by coupling a voltage multiplier 38 to the input of the transconductance amplifier. The voltage multiplier 38 multiplies the voltage signal VMx by the gain control signal 37 generated by the ratio gain control circuit 35. In this manner, the gain of the transconductance amplifier 33 is adjusted by a ratio relative to the reference voltage. The variable gain transconductance amplifier in FIG. 8 is illustrative only and not intended to be limiting. In other embodiments, other circuits and methods to adjust the gain of the transconductance amplifier can be used.

As thus configured, by using a reference system power monitor circuit 30-A and one or more system power monitor circuit 30-B, the reference power supply output current and the scaled power supply output currents from all of the power supplies can be summed together to generate a single system current signal $I_{SYS}$. The system current signal $I_{SYS}$ together with the reference voltage $V_{S1}$ as the system voltage signal can be used to determine the system power $P_{SYS}$. In FIG. 4, the summer 40 for summing the currents is illustrative only. In actual implementation, the current summing is performed at a controller circuit, such as the controller circuit of a voltage regulator module.

In one example, the power supply PS1 generates a power supply output voltage $V_{S1}$ of 12V which is used as the reference voltage $V_{REF}$. The power supply PS2 may also be programmed to generate a power supply output voltage $V_{S2}$ of 12V but due to variation in the accuracy of the power supply, which can be up to +/−10%, the power supply output voltage $V_{S2}$ may be actually 13.2V. In this case, at the system power monitor circuit 30B, a ratio of the power supply output voltage $V_{S2}$ to the reference voltage $V_{REF}$ is given as 13.2/12=1.1. In that case, the ratio gain control circuit 35 of the system power monitor circuit 30-B adjusts the gain of the transconductance amplifier 33 by the ratio 1.1. That is, the scaled current signal $I_{M2}$ is equal to 1.1($I_{S2}$). The current signal $I_{M2}$ thus generated is summed with the current signal $I_{M1}$ from the system power monitor circuit 30-A. The summed current is multiplied with the reference voltage $V_{S1}$ to obtain the system power value.

In the embodiment shown in FIG. 4, two different types of system power monitor circuit are used. The reference system power monitor circuit 30-A is used for the power supply that is selected as the reference power supply. In that case, no scaling is required for the reference power supply output current and the ratio gain control circuit can be omitted. The system power monitor circuit 30-B for the other power supplies are constructed with the ratio gain control circuit to scale the power supply output current based on the voltage ratio of the power supply output voltage and the reference voltage.

Figure 5:
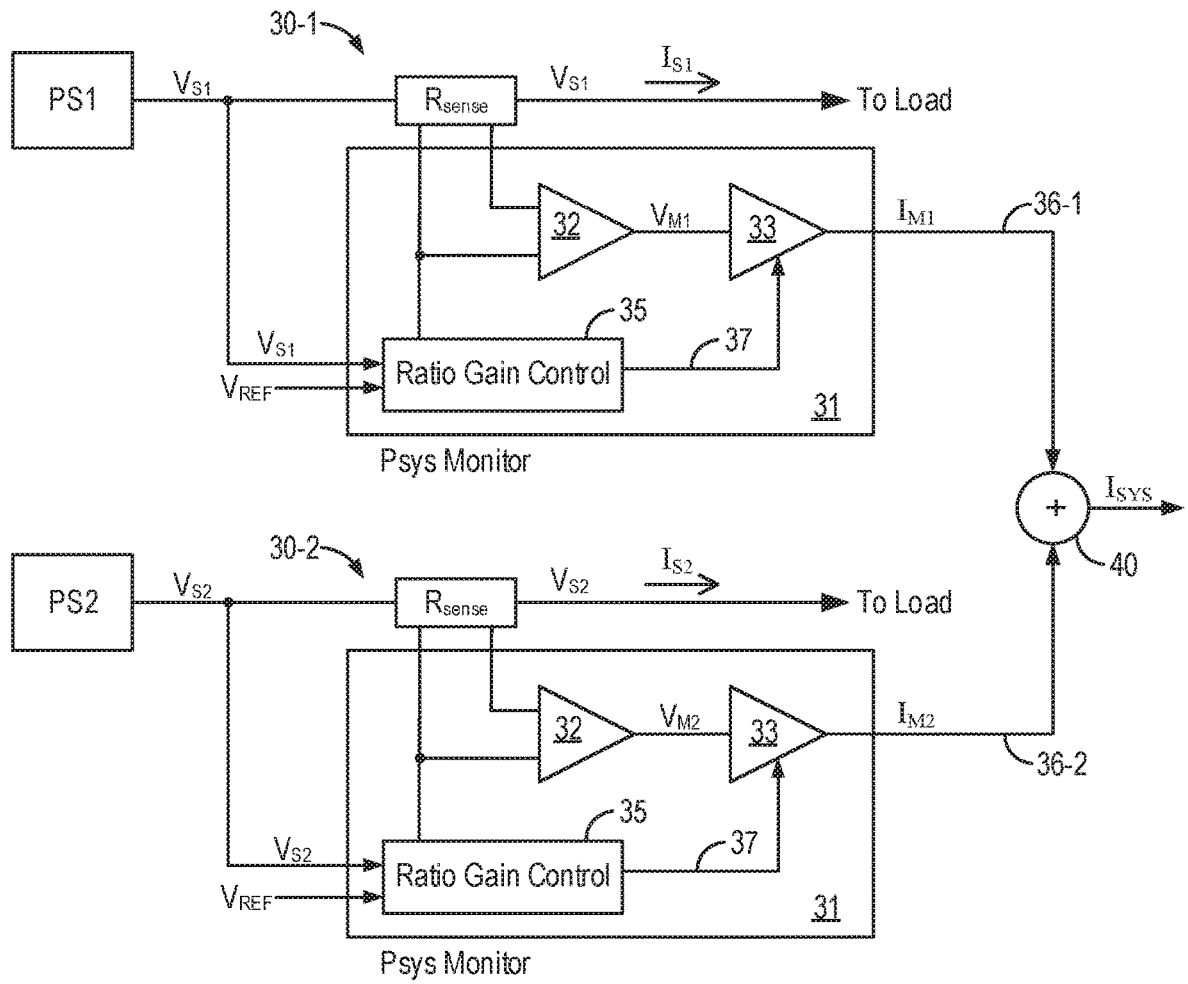
FIG. 5 is a circuit diagram illustrating the construction of system power monitor circuits in alternate embodiments.

In alternate embodiments of the present invention, the same system power monitor circuit can be used for all power supplies in an electronic system. FIG. 5 is a circuit diagram illustrating the construction of system power monitor circuits in alternate embodiments. Referring to FIG. 5, each power supply in an electronic system is coupled to a system power monitor circuit 30. For example, a first system power monitor circuit 30-1 is coupled to the power supply PS1 and a second system power monitor circuit 30-2 is coupled to the power supply PS2. The system power monitor circuits 30 are constructed in the same manner. Each system power monitor circuits 30 includes a differential amplifier 32 to sense the voltage across the respective current sense resistor $R_{sense}$ and to generate an output voltage $V_{MX}$ indicative of the current $I_{SX}$ flowing through the sense resistor $R_{sense}$. The output voltage $V_{MX}$ of the differential amplifier 32 is coupled to a transconductance amplifier 33 which converts the input voltage signal $V_{MX}$ to an output current signal $I_{MX}$. The system power monitor circuit 30 further includes a ratio gain control circuit 35 configured to adjust the gain of the transconductance amplifier 33 in proportion to the ratio of the power supply output voltage $V_{SX}$ and the reference voltage $V_{REF}$. The ratio gain control circuit 35 generates a gain control signal (node 37) in response to the ratio of the power supply output voltage $V_{SX}$ and to reference voltage $V_{REF}$. The gain control signal is used to adjust the gain of the transconductance amplifier 33 so as to scale the sensed current value. In this manner, the output current signal $I_{MX}$ is scaled by the respective voltage ratio and is therefore a scaled version of the power supply output current $I_{SX}$.

In one embodiment, the reference voltage $V_{REF}$ is a predetermined voltage provide to the system power monitor circuit 30. In other embodiments, the reference voltage $V_{REF}$ is a power supply output voltage of a selected power supply. For example, the power supply output voltage $V_{S1}$ of the power supply PS1 may be selected as the reference voltage $V_{REF}$. In that case, the power supply output voltage $V_{S1}$ is provided to the ratio gain control circuit 35 in all the system power monitor circuits 30 in the electronic system. For the power supply PS1, the ratio gain control circuit 35 receives the same input voltages and therefore the scaling ratio is 1. The scaled power supply output current $I_{M1}$ is actually scaled by a ratio of 1 and is technically not scaled.

As thus configured, the same construction of the system power monitor circuit can be used for all the power supplies in an electronic system, regardless of whether one of the power supplies is used as the reference power supply.

By using the system power monitor circuits 30, the scaled power supply output currents from all of the power supplies can be summed together to generate a single system current signal $I_{SYS}$. The system current signal $I_{SYS}$ together with the reference voltage $V_{REF}$ as the system voltage signal can be used to determine the system power $P_{SYS}$. In FIG. 5, the summer 40 for summing the currents is illustrative only. In actual implementation, the current summing is performed at a controller circuit, such as the controller circuit of a voltage regulator module.

In one example, a reference voltage $V_{REF}$ of 12V is provided. The power supply PS1 may be programmed to generate a power supply output voltage $V_{S1}$ of 12V but due to variation in the accuracy of the power supply, which can be up to +/−10%, the power supply output voltage $V_{S1}$ may be actually 11V. The power supply PS2 may be programmed to generate a power supply output voltage $V_{S2}$ of 12V but due to variation in the accuracy of the power supply, the power supply output voltage $V_{S2}$ may be actually 12.6V. In this case, at the system power monitor circuit 30-1, a ratio of the power supply output voltage $V_{S1}$ to the reference voltage $V_{REF}$ is given as 11/12=0.92. In that case, the ratio gain control circuit 35 of the system power monitor circuit 30-1 adjusts the gain of the transconductance amplifier 33 by the ratio 0.92. That is, the scaled current signal $I_{M1}$ is equal to 0.92($I_{S1}$). Meanwhile, at the system power monitor circuit 30-2, a ratio of the power supply output voltage $V_{S2}$ to the reference voltage $V_{REF}$ is given as 12.6/12=1.05. In that case, the ratio gain control circuit 35 of the system power monitor circuit 30-2 adjusts the gain of the transconductance amplifier 33 by the ratio 1.05. That is, the scaled current signal $I_{M2}$ is equal to 1.05 ($I_{S2}$). The current signal $I_{M2}$ thus generated is summed with the current signal $I_{M1}$ and the summed current is multiplied with the reference voltage (12V) to obtain the system power value.

Figure 6:
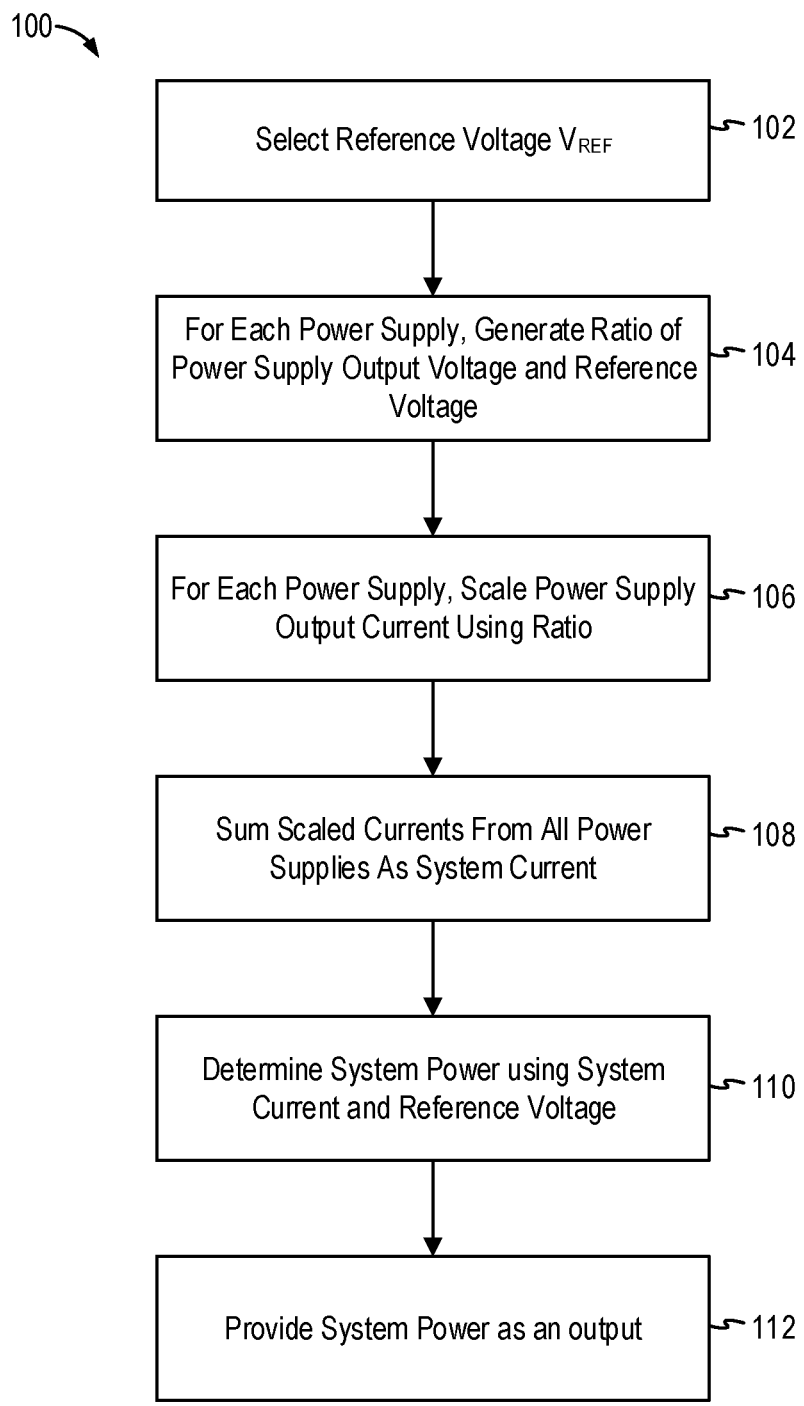
FIG. 6 is a flowchart illustrating the system power monitor method in embodiments of the present invention.

FIG. 6 is a flowchart illustrating the system power monitor method in embodiments of the present invention. The system power monitor method 100 may be implemented in an electronic system including multiple power supplies providing power to one or more loads. Referring to FIG. 6, a system power monitor method 100 starts by selecting a reference voltage $V_{REF}$ (102). The reference voltage can be a predetermined voltage or a selected power supply output voltage of one of the power supplies. The method 100 then generates, for each power supply, a ratio of the power supply output voltage to the reference voltage (104). The method 100 then scales, at each power supply, the power supply output current using the ratio (106). The method 100 then sums the scaled power supply output currents from all the power supplies as the system current (108). The method 100 then determines the system power using the system current and the reference voltage as the system voltage (110). The method provides the system power as an output (112).

In some embodiments, the system power monitor circuit described above can be applied in an electronic system including only a single power supply. In the case of a single power supply, the system power monitor circuit can be implemented in a similar manner as the system power monitor circuit 30-1 (FIG. 5) where the power supply output voltage $V_{S1}$ is coupled to the ratio gain control circuit 35 together with a predetermined reference voltage $V_{REF}$. The system power monitor circuit provides a scaled power supply output current value $I_{M1}$ which can be used to compute the system power by multiplying the current value $I_{M1}$ with the reference voltage as the system voltage signal. In one example, the current value $I_{M1}$ is coupled to a controller to perform the power computation. For example, the current value $I_{M1}$ can be provided to the controller circuit in a voltage regulator module of the electronic system.

The above detailed descriptions are provided to illustrate specific embodiments of the present invention and are not intended to be limiting. Numerous modifications and variations within the scope of the present invention are possible. The present invention is defined by the appended claims.

What is claimed is:

1. A system including a plurality of power supplies delivering power to respective loads, the system comprising:
   a plurality of system power monitor circuits, each system power monitor circuit being coupled to a respective power supply and configured to sense a power supply output current and a power supply output voltage of the respective power supply and to receive a reference voltage, each system power monitor circuit generating a scaled power supply output current value being the respective power supply output current scaled by a ratio of the respective power supply output voltage to the reference voltage; and a controller circuit configured to receive the scaled power supply output current value associated with each of the plurality of power supplies, to receive the reference voltage as a system voltage signal, to sum the scaled power supply output current values as a system current signal, and to provide a system power output signal based on the system current signal and the system voltage signal.

2. The system of claim 1, wherein the reference voltage comprises a predetermined voltage.

3. The system of claim 1, wherein the reference voltage comprises the power supply output voltage of a first power supply of the plurality of power supplies.

4. The system of claim 1, wherein the controller circuit is configured to provide the system power output signal by multiplying the system current signal with the system voltage signal.

5. The system of claim 1, wherein each system power monitor circuit comprises:
a differential amplifier configured to sense the power supply output current of the respective power supply and to generate a voltage signal indicative of the power supply output current;
a transconductance amplifier configured to receive the voltage signal indicative of the power supply output current and to generate an output current signal in response to a gain value of the transconductance amplifier, the output current signal being the scaled power supply output current value; and
a ratio gain control circuit configured to receive the power supply output voltage of the respective power supply and the reference voltage and to generate a gain control signal being indicative of a ratio of the power supply output voltage to the reference voltage, the gain control signal being coupled to the transconductance amplifier to adjust the gain value of the transconductance amplifier, the transconductance amplifier generating the scaled power supply output current value in response to the adjusted gain value.

6. The system of claim 1, further comprising a sense resistor coupled in series between each power supply and the respective load, each system power monitor circuit being configured to sense the power supply output current by sensing a voltage across the respective sense resistor.

7. The system of claim 1, wherein the controller circuit comprises a controller in a voltage regulator module coupled to a load of the system.

8. A system including two or more power supplies delivering power to respective loads, the system comprising:
a reference system power monitor circuit coupled to a first power supply and configured to sense a first power supply output current of the first power supply, the reference system power monitor circuit generating a reference power supply output current value;
one or more system power monitor circuits, each system power monitor circuit being coupled to a respective power supply other than the first power supply and configured to sense a power supply output current and a power supply output voltage of the respective power supply and to receive a first power supply output voltage of the first power supply as a reference voltage, each system power monitor circuit generating a scaled power supply output current value being the respective power supply output current scaled by a ratio of the respective power supply output voltage to the reference voltage; and a controller circuit configured to receive the reference power supply output current value and the scaled power supply output current values generated by the one or more power monitor circuits, to receive the reference voltage as a system voltage signal, to sum the reference power supply output current value and the scaled power supply output current values as a system current signal, and to provide a system power output signal based on the system current signal and the system voltage signal.

9. The system of claim 8, wherein the controller circuit is configured to provide the system power output signal by multiplying the system current signal with the system voltage signal.

10. The system of claim 8, wherein each system power monitor circuit comprises:
a differential amplifier configured to sense the power supply output current of the respective power supply and to generate a voltage signal indicative of the power supply output current;
a transconductance amplifier configured to receive the voltage signal indicative of the power supply output current and to generate an output current signal in response to a gain value of the transconductance amplifier, the output current signal being the scaled power supply output current value; and
a ratio gain control circuit configured to receive the power supply output voltage of the respective power supply and the reference voltage and to generate a gain control signal being indicative of a ratio of the power supply output voltage to the reference voltage, the gain control signal being coupled to the transconductance amplifier to adjust the gain value of the transconductance amplifier, the transconductance amplifier generating the scaled power supply output current value in response to the adjusted gain value.

11. The system of claim 8, wherein the reference system power monitor circuit comprises:
a differential amplifier configured to sense the power supply output current of the respective power supply and to generate a voltage signal indicative of the power supply output current; and
a transconductance amplifier configured to receive the voltage signal indicative of the power supply output current and to generate an output current signal in response to a gain value of the transconductance amplifier, the output current signal being the reference power supply output current value.

12. The system of claim 8, further comprising a sense resistor coupled in series between each power supply and the respective load, the reference system power monitor circuit and each system power monitor circuit being configured to sense the power supply output current by sensing a voltage across the respective sense resistor.

13. The system of claim 8, wherein the controller circuit comprises a controller in a voltage regulator module coupled to a load of the system.

14. A method of determining system power in an electronic system including two or more power supplies delivering power to respective loads, comprising:
selecting a reference voltage;

generating, for each power supply, a ratio of a power supply output voltage to the reference voltage;

scaling, at each power supply, a power supply output current using the ratio;

summing the scaled power supply output currents from all the power supplies as a system current signal;

determining a system power using the system current signal and the reference voltage as a system voltage signal, the system power being indicative of a power delivered by the two or more power supplies to the loads; and providing the system power as an output.

15. The method of claim 14, wherein selecting a reference voltage comprises selecting a predetermined voltage as the reference voltage.

16. The method of claim 14, wherein selecting a reference voltage comprises selecting the power supply output voltage of a first one of the power supplies as the reference voltage.

17. The method of claim 14, wherein determining a system power comprises determining the system power by multiplying the system current signal with the system voltage signal.

18. A system including at least one power supply delivering power to a respective load, the system comprising:

at least one system power monitor circuit, the system power monitor circuit being coupled to a respective power supply and configured to sense a power supply output current and a power supply output voltage of the respective power supply and to receive a reference voltage, the system power monitor circuit generating a scaled power supply output current value being the respective power supply output current scaled by a ratio of the respective power supply output voltage to the reference voltage; and a controller circuit configured to receive the scaled power supply output current value associated with the at least one power supply as the system current signal, to receive the reference voltage as a system voltage signal, and to provide a system power output signal based on the system current signal and the system voltage signal.

19. The system of claim 18, wherein the system power monitor circuit comprises:

a differential amplifier configured to sense the power supply output current of the respective power supply and to generate a voltage signal indicative of the power supply output current;

a transconductance amplifier configured to receive the voltage signal indicative of the power supply output current and to generate an output current signal in response to a gain value of the transconductance amplifier, the output current signal being the scaled power supply output current value; and a ratio gain control circuit configured to receive the power supply output voltage of the respective power supply and the reference voltage and to generate a gain control signal being indicative of a ratio of the power supply output voltage to the reference voltage, the gain control signal being coupled to the transconductance amplifier to adjust the gain value of the transconductance amplifier, the transconductance amplifier generating the scaled power supply output current value in response to the adjusted gain value.

20. The system of claim 18, wherein the controller circuit comprises a controller in a voltage regulator module coupled to a load of the system.

\* \* \* \* \*